United States Patent [19]

Azumi et al.

[11] Patent Number: 4,999,595
[45] Date of Patent: Mar. 12, 1991

[54] LC FILTER STRUCTURE

[75] Inventors: Takeshi Azumi; HIroshi Morii; Yasuyuki Naito; Yukio Sakabe, all of Kyoto, Japan

[73] Assignee: Murata Manufacturing Co., Ltd., Japan

[21] Appl. No.: 300,422

[22] Filed: Jan. 23, 1989

[30] Foreign Application Priority Data

Jan. 22, 1988 [JP] Japan .................................. 63-13274
May 30, 1988 [JP] Japan .................................. 63-131985

[51] Int. Cl.⁵ .............................................. H03H 7/00
[52] U.S. Cl. ..................................... 333/184; 333/185; 361/329; 439/607
[58] Field of Search ............................... 333/181–185; 361/302, 328–330; 439/607, 620

[56] References Cited

U.S. PATENT DOCUMENTS 3,538,464 11/1970 Walsh ................................... 333/182
3,842,374 10/1974 Schlicke ............................... 333/182
4,262,268 4/1981 Shimada et al. ..................... 333/182
4,494,092 1/1985 Griffin ................................... 333/182
4,791,391 12/1988 Linnell et al. ........................ 333/184
4,853,659 8/1989 Kling .............................. 439/620 X Primary Examiner—Eugene R. Laroche
Assistant Examiner—Seung Ham
Attorney, Agent, or Firm—Ostrolenk, Faber, Gerb & Soffen

[57] ABSTRACT

An LC filter comprises a ceramic laminate which has at least one dielectric part defining an exposed surface and at least one magnetic part integrated with the dielectric part in a layered manner. The ceramic laminate is provided with at least one through hole which has a first opening positioned on the exposed surface of the dielectric part and commonly passes through both of the dielectric part and the magnetic part. A connector pin is inserted in the through hole while a first electrode of a capacitor is formed on the exposed surface in a peripheral region of the first opening to be electrically connected with the connector pin. A second electrode of the capacitor is provided to be opposite to the first electrode through a dielectric member forming the dielectric part except for a peripheral region of the through hole, so that the second electrode is extracted toward the exterior of the ceramic laminate as a grounded electrode.

7 Claims, 10 Drawing Sheets

LC FILTER STRUCTURE

BACKGROUND OF THE INVENTION

1. Field of the Invention

The present invention relates to an LC filter which is provided with a capacitor and an inductor in relation to one through conductor, and more particularly, it relates to a high-frequency filter which can be housed in a connector to effectively remove high-frequency noise.

2. Description of the Background Art

In order to house a high-frequency filter in a connector, through parts such as through capacitors or through inductors have been generally employed to receive connector pins respectively.

In such structure, however, it is necessary to mount the through parts one by one on the connector pins, whereby manufacturing steps are added and the manufacturing cost is also increased in response.

A high-frequency filter requires both a capacitor and an inductor in order to attain a sufficient noise removing effect. In general, however, only a through capacitor or a through inductor is provided in relation to one connector pin. Thus, a noise removing effect of such a filter is inferior to that of an LC filter which is formed by discrete circuit components.

Although it is possible to integrate both a capacitor and an inductor into a filter in relation to one connector pin, the structure of such capacitor and/or inductor is complicated while additional manufacturing steps are required to further increase the manufacturing cost in this case.

SUMMARY OF THE INVENTION

Accordingly, an object of the present invention is to provide an LC filter which is provided with a capacitor and an inductor in relation to one through conductor, which provides an excellent noise removing effect, and which can be manufactured through simpler manufacturing steps and advantageously housed, in a connector.

In order to solve the aforementioned technical problems of the prior art, the inventive LC filter comprises a ceramic laminate having at least one dielectric part and at least one magnetic part which are integrated with each other in a layered manner. At least the dielectric part defines an exposed surface.

The ceramic laminate is provided with at least one through hole which has a first opening located on the exposed surface of the dielectric part and commonly passes through both the dielectric part and the magnetic part, and a through conductor such as a connector pin is inserted in the through hole.

A first electrode of a capacitor is provided on the exposed surface in a peripheral region of the first opening to be electrically connected with the through conductor. On the other hand, a second electrode of the capacitor is provided to be opposite to the first electrode through a dielectric member forming the dielectric part except for a peripheral region of the through hole, so that the second electrode is extracted toward the exterior of the ceramic laminate as a grounded electrode.

Referring now to the capacitor and inductor forming the inventive LC filter, the capacitor is provided across a first electrode which is electrically connected with a through conductor on an exposed surface of a dielectric part and a second electrode which is opposite to the first electrode through a dielectric member forming the dielectric part. On the other hand, the inductor is formed in a region where a connector pin passes through a magnetic part.

According to the present invention, a through conductor is simply inserted in a through hole provided in a ceramic laminate to be electrically connected with a first electrode which is formed on an exposed surface, thereby to form an LC filter comprising a capacitor and an inductor in relation to the through conductor. For example, the ceramic laminate can be employed as a mechanical holding member for a connector pin, which implements the through conductor, while providing the holding member with functions of a capacitor and an inductor. Thus, such an LC filter can be advantageously in a connector.

According to the inventive LC filter, therefore, insertion loss in a high frequency range can be increased as compared with a filter which is provided with only a capacitor or an inductor, thereby to attain a larger noise removing effect.

The present invention is particularly effective when the aforementioned through conductor is formed by a plurality of connector pins so that a plurality of the aforementioned first electrodes are provided in relation to respective ones of the plurality of connector pins to be electrically independent of each other and the second electrode is provided to be commonly opposite to the plurality of first electrodes. In other words, a plurality of connector pins are simply mounted on one ceramic laminate in a desired manner, so that all the connector pins are provided with a function for serving as a high-frequency filter.

According to the present invention, further, a ceramic laminate can be formed by a dielectric part and a magnetic part, which are cofired to be integrated with each other, by appropriately selecting a dielectric material for the dielectric part and a magnetic material for the magnetic part.

The ceramic laminate may include a varistor part in addition to the dielectric part and the magnetic part, thereby to provide the LC filter with a surge absorbing function through a varistor function of the varistor part.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
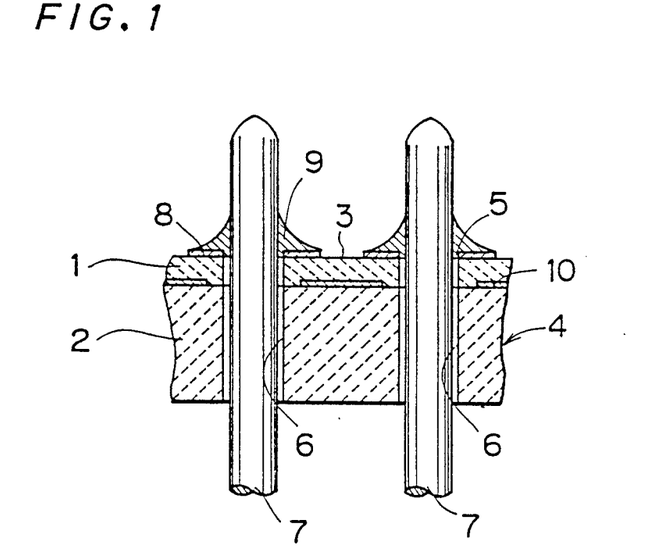
FIG. 1 is a sectional view showing a principal part of an embodiment of the present invention in an enlarged manner.
Figure 2:
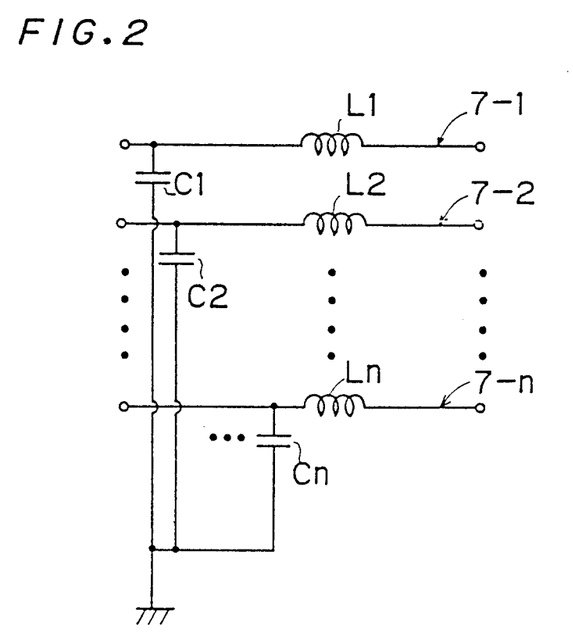
FIG. 2 is an equivalent circuit diagram of the LC filter shown in FIG. 1.

FIG. 1 is a sectional view showing a principal part of an embodiment of the present invention in an enlarged manner. FIG. 2 is an equivalent circuit diagram of an LC filter which is obtained through the structure shown in FIG. 1.

Referring to FIG. 1, the LC filter comprises a ceramic laminate 4 having a dielectric part 1 and a magnetic part 2 which are integrated with each other in a layered manner, and at least the dielectric part 1 defines an exposed surface 3. FIG. 1 shows a section taken along the direction of thickness of the ceramic laminate 4, which is in the form of a plate as a whole.

The ceramic laminate 4 is provided with a plurality of through holes 6, each of which has a first opening 5 positioned on the exposed surface 3 of the dielectric part 1 and commonly passes through both of the dielectric part 1 and the magnetic part 2. A connector pin 7 is inserted in each through hole 6.

A first electrode 8 of a capacitor is formed on the exposed surface 3 of the dielectric part 1 in a peripheral region of each first opening 5. The first electrode 8, which has an annular plan configuration, for example, is electrically connected with the connector pin 7 by a solder member 9, for example. Through such soldering, the connector pin 7 is mechanically held with respect to the ceramic laminate 4.

A second electrode 10 of the capacitor is provided to be opposite to the first electrode 8 through a dielectric member forming the dielectric part 1. In this embodiment, the second electrode 10 is located to extend along the interface between the dielectric part 1 and the magnetic part 2, except for the peripheral region of the through hole 6.

A plurality of the aforementioned first electrodes 8 are provided in relation to respective ones of a plurality of connector pins 7 to be electrically independent of each other, while the second electrode 10 is provided to be commonly opposite to the plurality of first electrodes 8. The second electrode 10, which is adapted to serve as a grounded electrode, is extracted toward the exterior of the ceramic laminate 4 as hereinafter illustrated and described According to the structure shown in FIG. 1, provided are L-type filters which comprise capacitors C1, C2, . . . , Cn and inductors L1, L2, . . . , Ln in relation to respective ones of connector pins 7-1, 7-2, . . . , 7-n, as shown in FIG. 2. In relation to the connector pin 7-1 shown in FIG. 2, for example, the capacitor C1 is formed across the first and second electrodes 8 and 10 shown in FIG. 1, while the inductor L1 is formed in the portion where the connector pin 7 shown in FIG. 1 passes through the magnetic part 2.

A method of manufacturing the LC filter shown in FIGS. 1 and 2 is now described with reference to FIGS. 3 to 7.

Figures 3, 8:
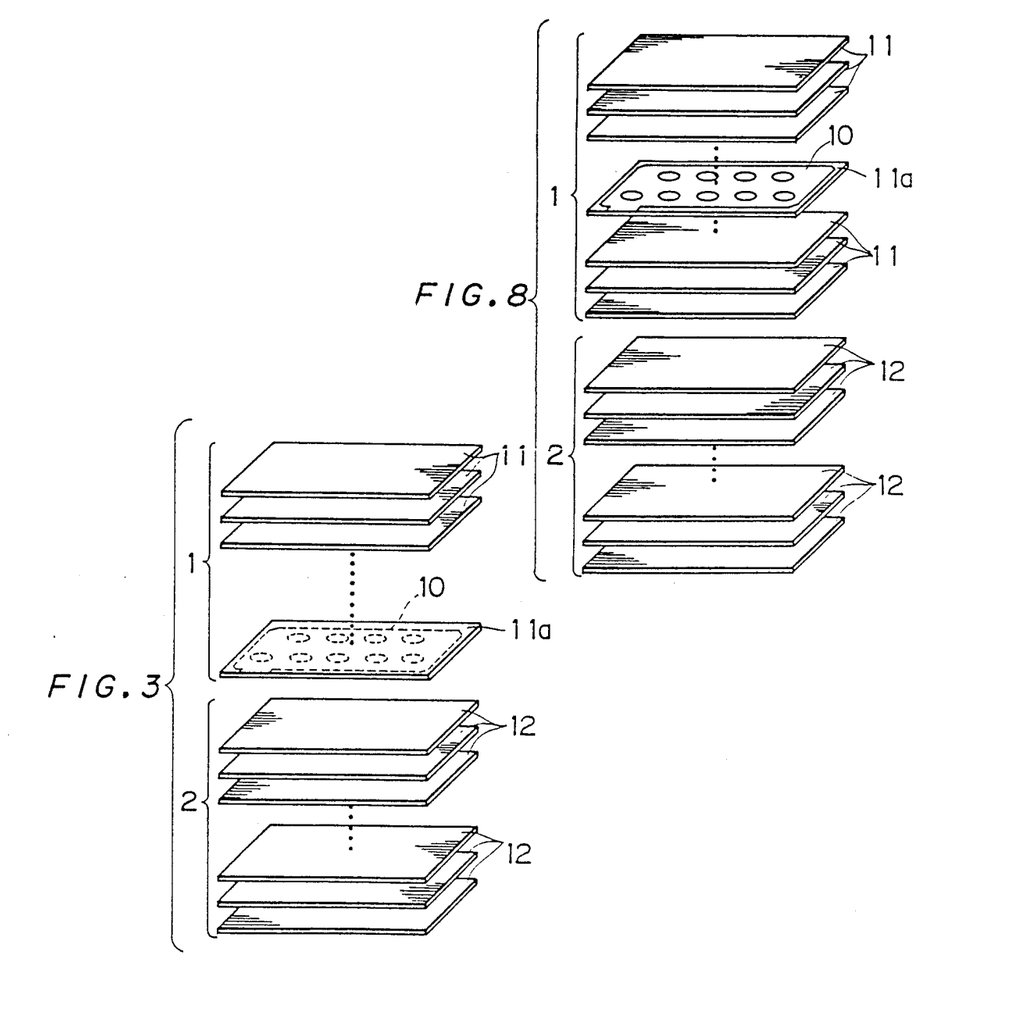
FIG. 3 is a perspective view illustrating the mode of stacking of dielectric green sheets 11 and magnetic green sheets 12 for obtaining a ceramic laminate 4 shown in FIG. 1.
FIG. 8 is a perspective view for illustrating another embodiment of the present invention in correspondence to FIG. 3.

First, a dielectric material forming Pb system composite perovskite, which is composed of 0.5 $Pb(Mg_{1/3}Nb_{2/3})O_3 + 0.5\ Pb(Mg_{1/2}W_{1/2})O_3$, for example, is selected as a material for the dielectric part 1. On the other hand, a magnetic material forming Ni-Zn system ferrite, which is composed of 0.17 $NiO + 0.30\ ZnO + 0.05\ CuO\ 0.48\ Fe_2O_3$, for example, is selected as a material for the magnetic part 2. About 10 percent by weight of an organic resin binder is added to each of such materials, to prepare dielectric green sheets 11 and magnetic green sheets 12 of tens of micrometers in thickness by a doctor blade method respectively. The dielectric and magnetic green sheets 11 and 12 are stacked with each other as shown in FIG. 3. Namely, the aforementioned dielectric part 1 is formed by a plurality of dielectric green sheets 11 and the magnetic part 2 is formed by a plurality of magnetic green sheets 12.

Figure 4:
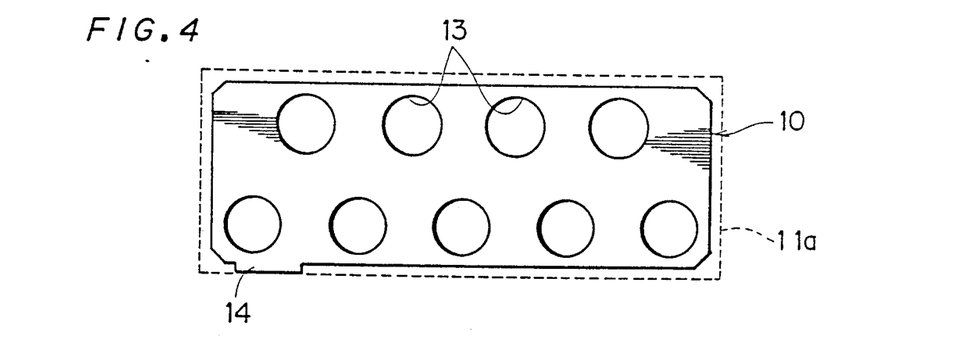
FIG. 4 is a plan view showing the configuration of an electrode 10 which is formed on a dielectric green sheet 11a shown in FIG. 3.

Within the plurality of stacked dielectric green sheets 11, the lowermost sheet 11a is provided with the aforementioned second electrode 10, as shown in FIG. 3. The second electrode 10 is formed by printing conductive paste which is mainly composed of silver. FIG. 4 shows a plan configuration of the second electrode 10. As shown in FIG. 4, the second electrode 10 is provided with circular defective parts 13, for example, in correspondence to portions for defining the through holes 6 in a later step and peripheral regions thereof. As understood from the contour of the lowermost dielectric green sheet 11a shown in broken lines, the electrode 10 has an extracting portion 14 which extends toward an edge of the dielectric green sheet 11a.

Figure 5:
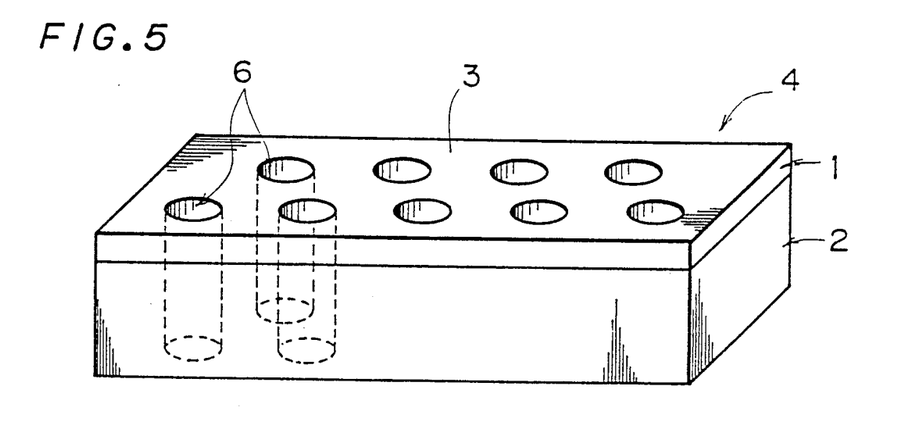
FIG. 5 is a perspective view showing the ceramic laminate 4 which is provided with through holes 6 after stacking of the dielectric green sheets 11 and the magnetic green sheets 12 shown in FIG. 3.

The plurality of dielectric green sheets 11 and the plurality of magnetic green sheets 12 are vertically stacked with each other in the relation shown in FIG. 3, and then pressure-molded by a press. Thus, a ceramic laminate 4 is formed by one dielectric part 1 and one magnetic part 2, as shown in FIG. 5. Then the through holes 6 for receiving the connector pins 7 are formed by a drill, for example. Each of the through holes 6 commonly passes through both of the dielectric part 1 and the magnetic part 2.

The ceramic laminate 4 shown in FIG. 5 which is in an unfired state, is fired at a temperature of 1000° C. for two hours, for example, so that the dielectric part 1 and the magnetic part 2 are integrally sintered.

Figure 6:
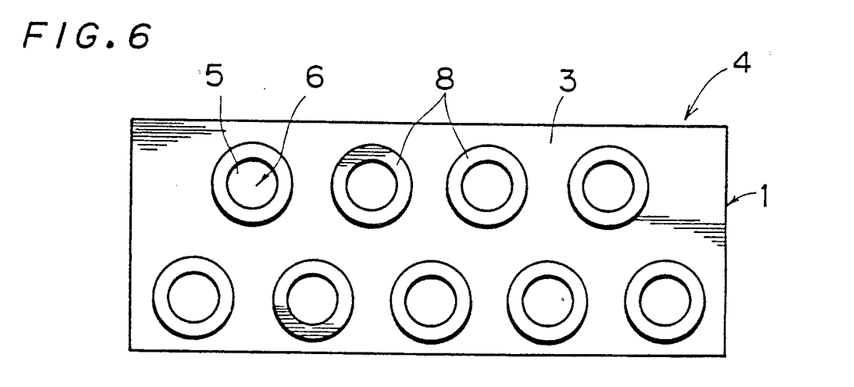
FIG. 6 is a plan view showing the ceramic laminate 4 which is provided with electrodes 8 on an exposed surface 3 of its dielectric part 1.

The ceramic laminate 4 which is integrated by such cofiring is provided with the aforementioned annular first electrodes 8, for example, on the exposed surface 3 of the dielectric part 1, as shown in FIG. 6. The first electrodes 8 are formed in the peripheral regions of the first openings 5 of the through holes 6.

Figure 7:
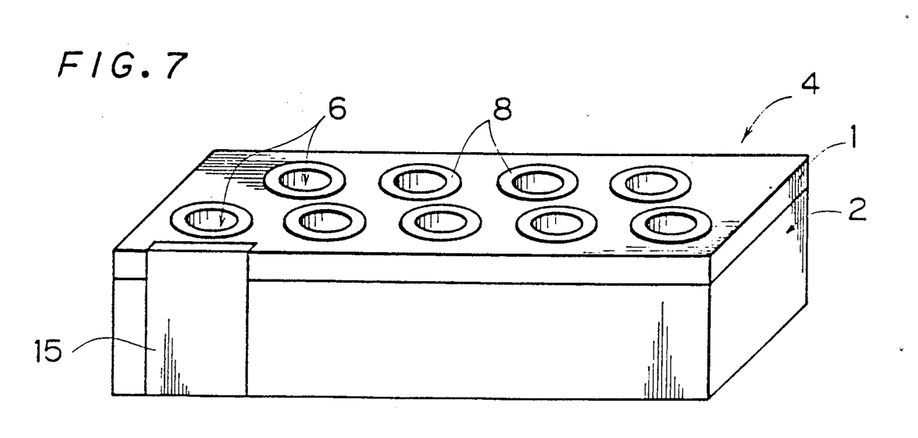
FIG. 7 is a perspective view showing the ceramic laminate 4 which is further provided with an external ground electrode 15.

As shown in FIG. 7, on the other hand, an external ground electrode 15 is formed on a side surface of the ceramic laminate 4 exposing the aforementioned extracting portion 14 (FIG. 4) of the second electrode 10. Thus, the external ground electrode 15 is electrically connected with the second electrode 10. Both of the electrodes 8 and the external ground electrode 15 are formed by applying conductive paste, which is mainly composed of silver, and baking the same. The electrodes 8 and 15 may be baked at the same time.

The connector pins 7 are inserted in the respective through holes 6 of the ceramic laminate 4, which is in the state shown in FIG. 7, to be electrically connected with the electrodes 8 by the solder members 9, thereby to obtain an L-type LC filter which is in the structure shown in FIG. 1 and has an equivalent circuit shown in FIG. 2.

In place of the position shown in FIG. 7, the external ground electrode 15 may be formed in another position of the ceramic laminate 4.

Although the second electrode 10 for serving as a grounded electrode is provided to extend along the interface between the dielectric part 1 and the magnetic part 2 in the above embodiment, the same may be provided in an inner portion of the dielectric part 1, for example, as shown in FIG. 8.

Figure 9:
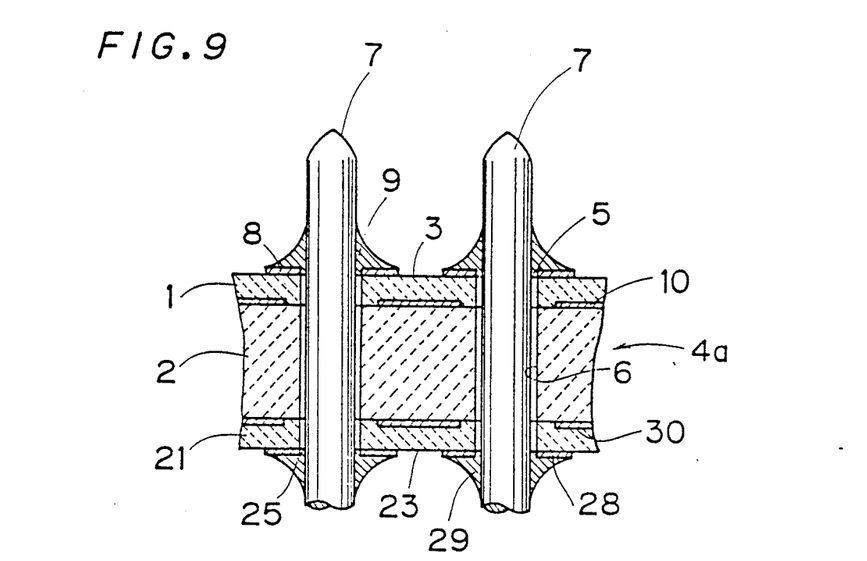
FIG. 9 is a sectional view for illustrating still another embodiment of the present invention in correspondence to FIG. 1.

FIG. 9 is a sectional view for illustrating another embodiment of the present invention, in correspondence to FIG. 1. According to this embodiment, a ceramic laminate 4a is formed by one magnetic part 2 and two dielectric parts 1 and 21 which are located on both sides thereof. That is, structure relating to the dielectric part 21 is added to that shown in FIG. 1. Thus, components corresponding to those of the embodiment shown in FIG. 1 are indicated by the same reference numerals to omit redundant description, and the following description is made mainly with reference to the structure relating to the dielectric part 21.

Referring to FIG. 9, a first electrode 28 of a second capacitor is provided on an exposed surface 23 of the dielectric part 21 in a peripheral region of a second opening 25 of each through hole 6, in a similar manner to the aforementioned electrode 8. The electrode 28 is electrically connected with a connector pin 7 through a solder member 29. On the other hand, a second electrode 30, which is paired with the first electrode 28 to form the second capacitor, is provided to extend along the interface between the dielectric part 21 and the magnetic part 2. The second electrode 30 is substantially similar in configuration to the aforementioned second electrode 10.

Figure 10:
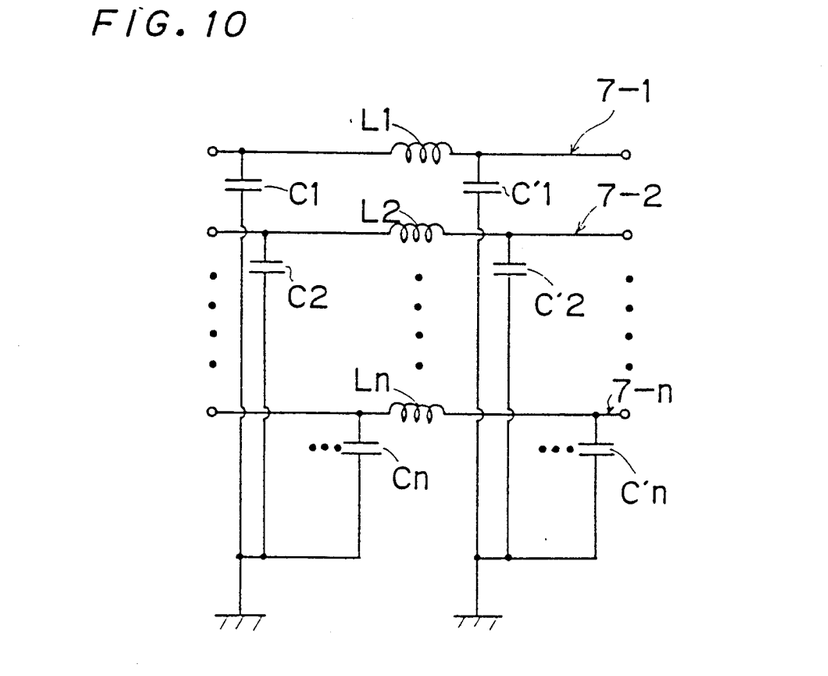
FIG. 10 is an equivalent circuit diagram of the LC filter shown in FIG. 9.

Thus, according to the structure shown in FIG. 9, π-type LC filters shown in FIG. 10 are formed in relation to connector pins 7-1, 7-2, ..., 7-n. That is, first capacitors C1, C2, ..., Cn, second capacitors C'1, C'2, C'n and inductors L1, L2, ..., Ln are provided in relation to respective ones of the connector pins 7-1, 7-2, ..., 7-n.

Figure 11:
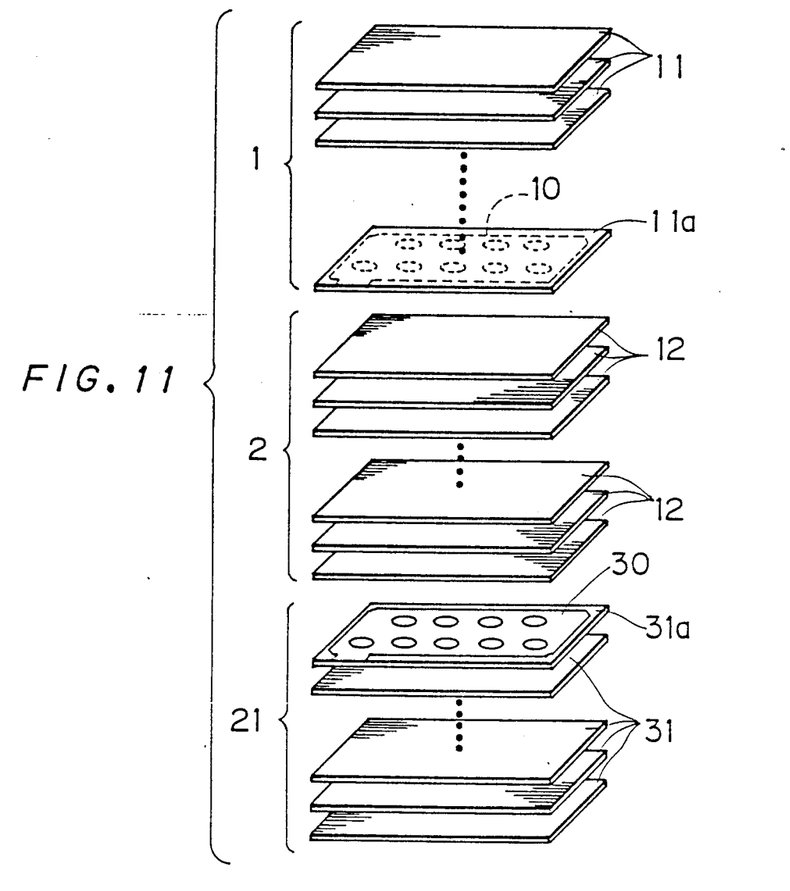
FIGS. 11, 12 and 13 are perspective views for illustrating the embodiment shown in FIG. 9 in correspondence to FIGS. 3, 5 and 7.

FIG. 11 is a perspective view illustrating the state of green sheets which are stacked to obtain the structure shown in FIG. 9, in correspondence to FIG. 3. In order to obtain the dielectric part 21, a plurality of dielectric green sheets 31 are stacked under the magnetic part 2. The aforementioned second electrode 30 is formed on one surface of the uppermost sheet 31a within the plurality of dielectric green sheets 31.

Figure 12:
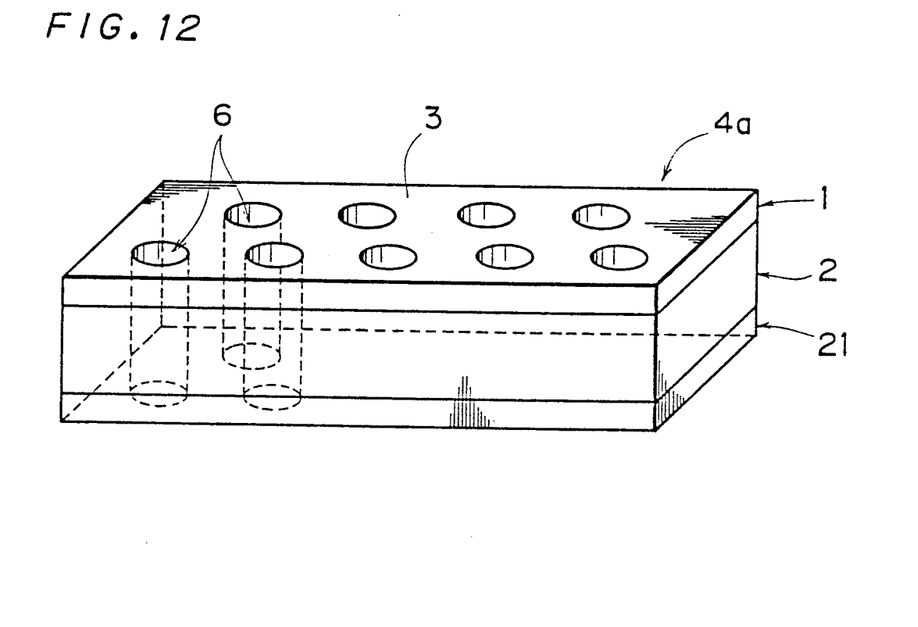

The dielectric green sheets 11, a plurality of magnetic green sheets 12 and a plurality of dielectric green sheets 31 shown in FIG. 11 are stacked with each other and pressurized, thereby to obtain a ceramic laminate 4a, which comprises one magnetic part 2 and two dielectric parts 1 and 21 which are located on both sides thereof, as shown in FIG. 12. Similarly to the aforementioned embodiment, through holes 6 are formed by a drill or the like to commonly pass through the dielectric parts 1 and 21 and the magnetic part 2. The dielectric parts 1 and 21 and the magnetic part 2 are cofired to be integrated with each other.

Figure 13:
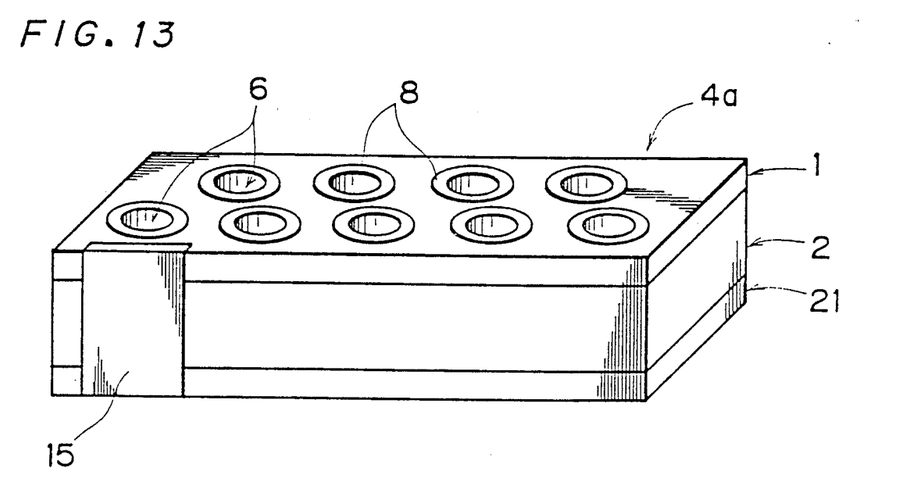

FIG. 13 is a perspective view corresponding to FIG. 7. An external ground electrode 15 provided on a side surface of a ceramic laminate 4a is adapted to commonly extract electrodes 10 and 30.

Figure 14:
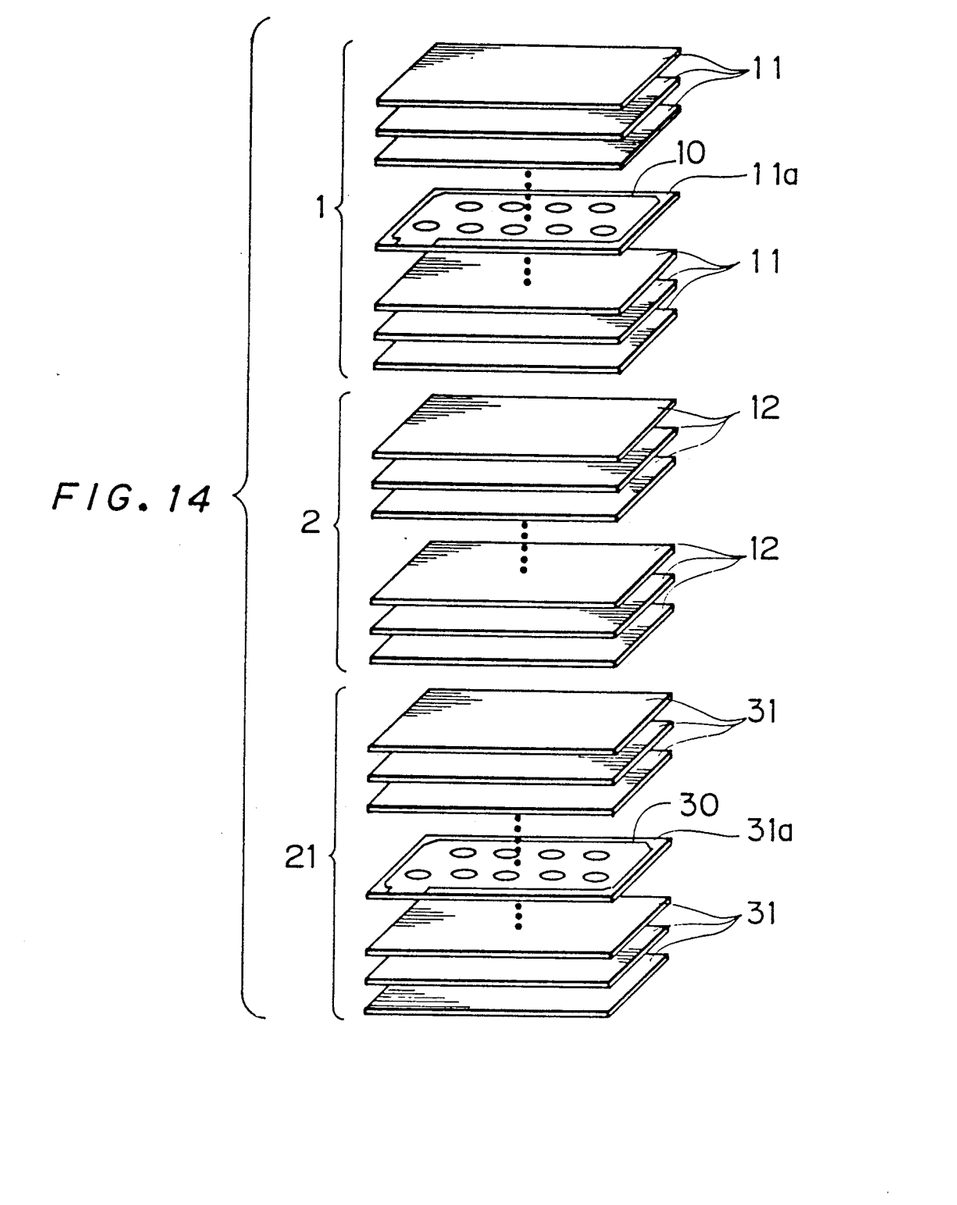
FIG. 14 is a perspective view for illustrating a further embodiment of the present invention in correspondence to FIG. 11.

FIG. 14 shows a modification of the stacked state shown in FIG. 11, in which electrodes 10 and 30 are provided in inner portions of corresponding dielectric parts 1 and 21, similarly to the modification shown in FIG. 8 in relation to FIG. 3.

Figure 15:
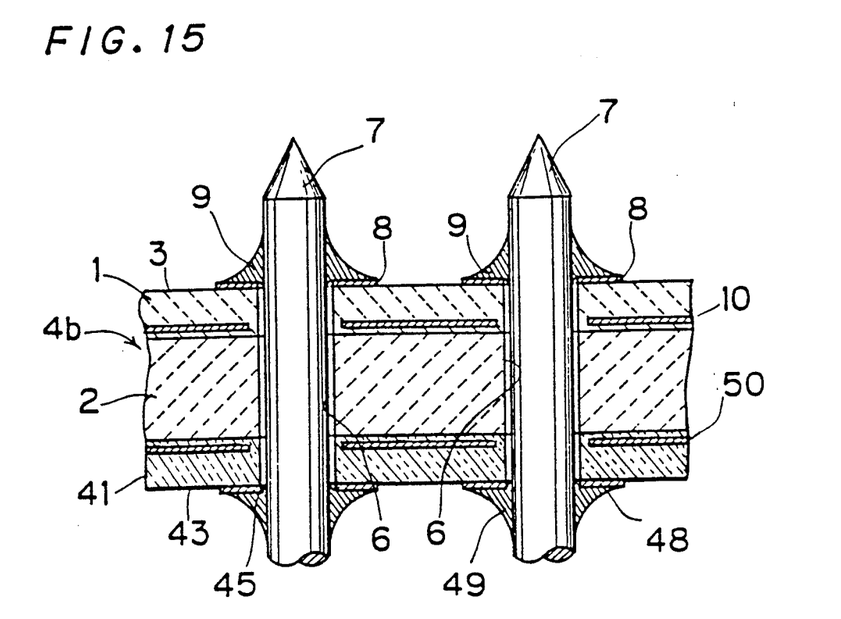
FIG. 15 is a sectional view for illustrating a further embodiment of the present invention in correspondence to FIG. 1.

FIG. 15 is a sectional view for illustrating a further embodiment of the present invention, in correspondence to FIG. 1 (or FIG. 8). A ceramic laminate 4b according to this embodiment comprises one magnetic part 2, which is held between a dielectric part 1 and a varistor part 41. That is, this embodiment is substantially similar to that shown in FIG. 1, except for essential difference relating to the varistor part 41. Therefore, parts corresponding to those in FIG. 1 are indicated by the same reference numerals, to omit redundant description.

Referring to FIG. 15, a first varistor electrode 48 is provided on an exposed surface 43 of the varistor part 41 in a peripheral region of a second opening 45 of each through hole 6, in a similar mode to the electrode 8 which is provided on the aforementioned exposed surface 3. The first varistor electrode 48 is electrically connected with a connector pin 7 by a solder member 49. On the other hand, a second varistor electrode 50 is provided to be opposite to the first varistor electrode 48 through a ceramic material forming the varistor part 41 and having a varistor function, in a configuration substantially similar to that of the second electrode 10 for the aforementioned capacitor.

Figure 16:
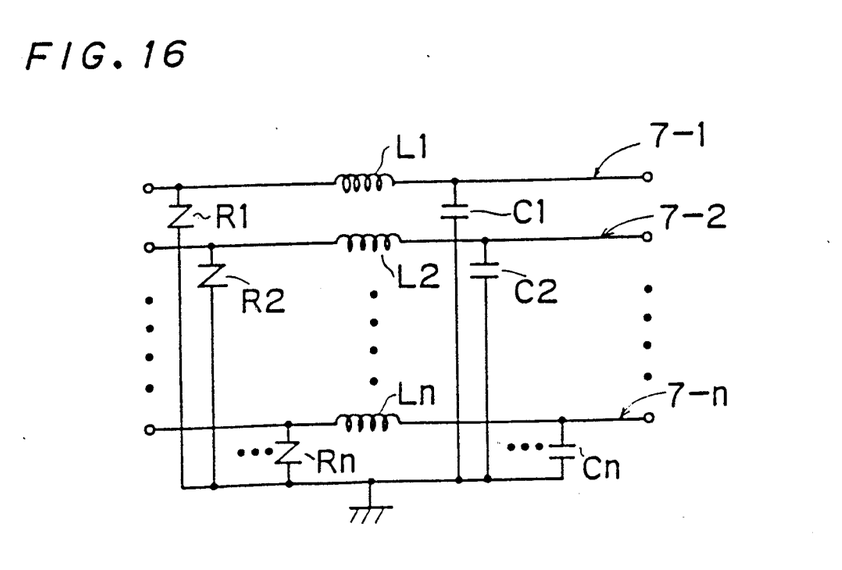
FIG. 16 is an equivalent circuit diagram of the LC filter shown in FIG. 15.

According to the structure shown in FIG. 15, an LC filter having a varistor function is formed in relation to each of connector pins 7-1, 7-2, ..., 7-n, as shown in FIG. 16. That is, capacitors C1, C2, ..., Cn, inductors L1, L2, ..., Ln and varistors R1, R2, ..., Rn are provided in relation to respective ones of the connector pins 7-1, 2, ..., 7-n.

Figure 17:
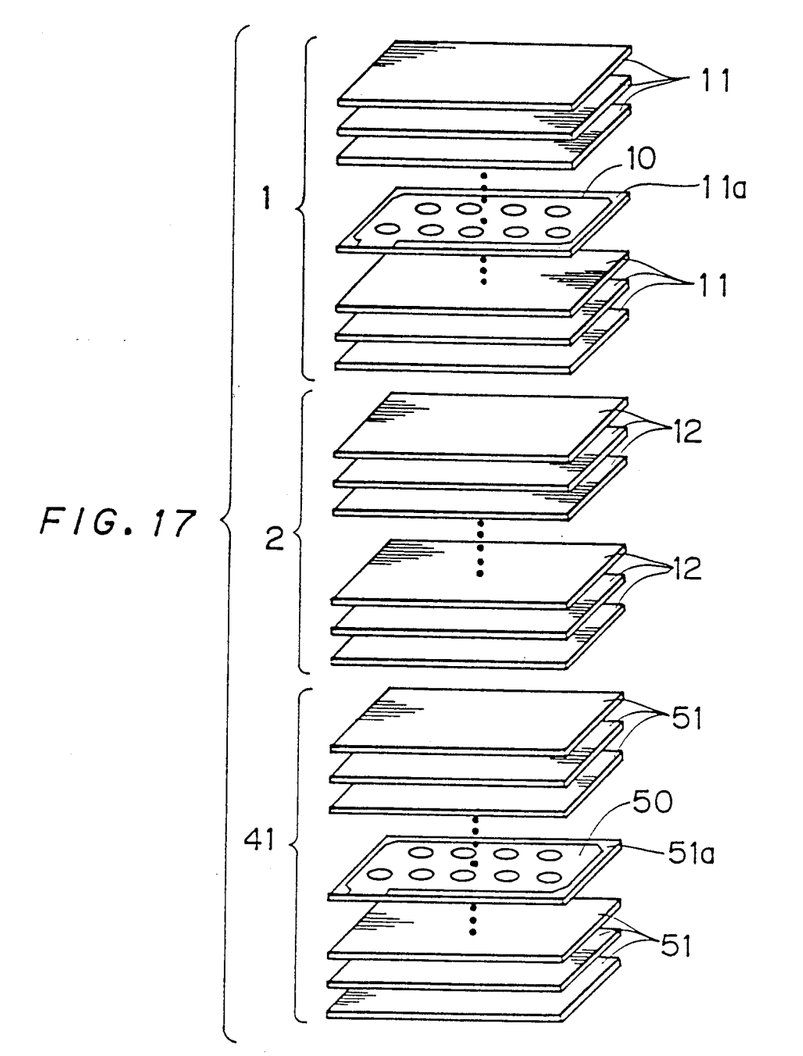
FIGS. 17, 18 and 19 are perspective views for illustrating the embodiment shown in FIG. 15 in correspondence to FIGS. 3, 5 and 7.

FIG. 17 is a perspective view for illustrating green sheets, which are stacked to obtain the structure shown in FIG. 15, in correspondence to FIG. 3. In order to obtain the varistor part 41, a plurality of varistor green sheets 51 of a ceramic material for providing a varistor function are stacked under the magnetic part 2. The aforementioned second varistor electrode 50 is provided on one surface of a specific sheet 51a within these varistor green sheets 51.

Figure 18:
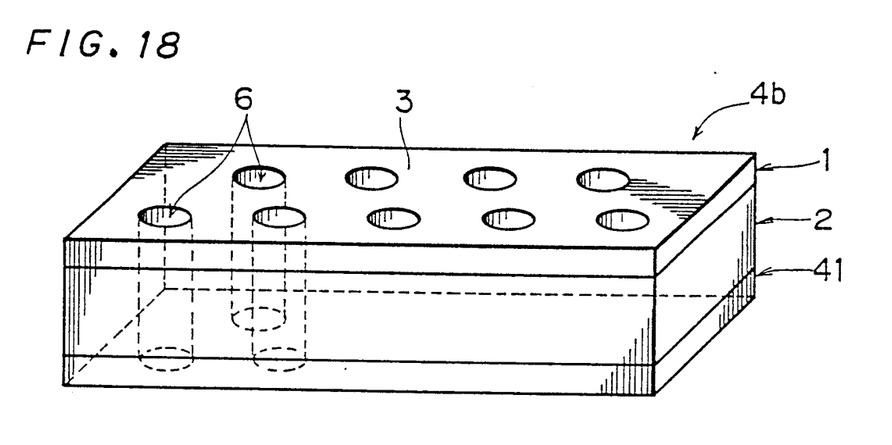

A plurality of dielectric green sheets 11, a plurality of magnetic green sheets 12 and the varistor green sheets 51 are stacked with each other as shown in FIG. 17 and then pressurized, thereby to obtain a ceramic laminate 4b which comprises a magnetic part 2 held between a dielectric part 1 and a varistor part 41, as shown in FIG. 18. Similarly to the aforementioned embodiments, through holes 6 are formed by a drill or the like to commonly pass through the dielectric part 1, the magnetic part 2 and the varistor part 41. The dielectric part 1, the magnetic part 2 and the varistor part 41 are cofired to be integrated with each other.

When the dielectric part 1 and the magnetic part 2 are prepared from the specific dielectric and magnetic materials described with reference to FIGS. 3 to 7 for such cofiring, the varistor part 41 is preferably prepared from a varistor material which is composed of 0.99 $ZnO+0.005\ Pr_6O_{11}+0.005\ Co_2O_3$.

Figure 19:
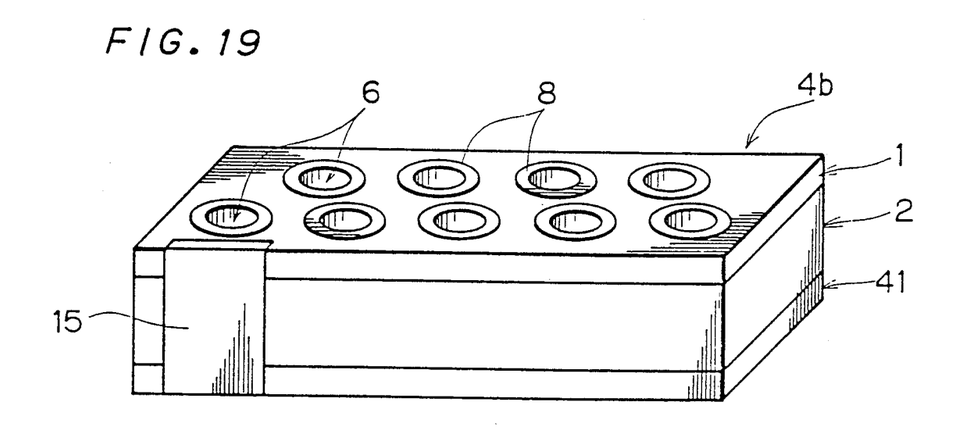

FIG. 19 is a perspective view corresponding to FIG. 7. An external ground electrode 15 provided on a side surface of a ceramic laminate 4b is adapted to commonly extract electrodes 10 and 50.

In the embodiment shown in FIG. 15, the electrodes 10 and 50 are provided in inner portions of the dielectric part 1 and the varistor part 41, respectively, as clearly understood from FIG. 17. However, an electrode corresponding to the second electrode 10 of the capacitor may be provided to extend along the interface between the dielectric part 1 and the magnetic part 2 while an electrode corresponding to the varistor electrode 50 may be provided to extend along the interface between the varistor part 41 and the magnetic part 2, similarly to the embodiments shown in FIGS. 1 and 9.

While the present invention has been described with reference to the embodiments shown in the drawings, various modifications may be applied within the scope of the present invention.

For example, although a plurality of connector pins pass through one ceramic laminate in each of the embodiments shown in the drawings, only one connector pin, i.e., through conductor, may pass through one ceramic laminate, within the scope of the present invention.

Further, although a dielectric part and a magnetic part, or a magnetic part and a varistor part, are cofired to be integrated with each other thereby to form a ceramic laminate in each of the embodiments shown in the drawings, a ceramic laminate may be formed by adhering a dielectric part and a magnetic part, as well as a varistor part if necessary, which are obtained by separate firing, in a later step.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An LC filter comprising:
   a cofired ceramic laminate having at least one dielectric part, defining an exposed surface, and at least one magnetic part integrally sintered with said dielectric part in a layered manner, said ceramic laminate being provided with at least one through hole having a first opening positioned at said exposed surface of said dielectric part and commonly passing through both said dielectric part and said magnetic part;
   through conductor means inserted in said through hole;
   first capacitor electrode means provided on said exposed surface at a peripheral region of said first opening and electrically connected with said through conductor means;
   second capacitor electrode means opposing said first capacitor electrode means through at least a part of a dielectric member forming said dielectric part, thereby to form electrostatic capacitance across said first and second capacitor electrode means; and
   external ground electrode means being electrically connected to said second capacitor electrode means and formed on said ceramic laminate.

2. An LC filter in accordance with claim 1, wherein said dielectric part is formed of Pb system composite perovskite.

3. An LC filter in accordance with claim 1, wherein said magnetic part is formed of Ni-Zn system ferrite.

4. An LC filter in accordance with claim 1, wherein said through conductor means comprises a plurality of connector pins, said first electrode means comprises a plurality of first electrodes which are formed in relation to respective ones of said plurality of connector pins and are electrically independent of each other, and said second electrode means commonly opposes said plurality of first electrodes.

5. An LC filter in accordance with claim 1, wherein said ceramic laminate comprises one said dielectric part and one said magnetic part.

6. An LC filter in accordance with claim 1, wherein said ceramic laminate comprises one said magnetic part and two said dielectric parts positioned on both sides thereof.

7. An LC filter in accordance with claim 1, wherein said cofired ceramic laminate further comprises a varistor part which is integrally sintered with said dielectric part and said magnetic part in a layered manner, said varistor part comprising a ceramic material having a varistor function, a first varistor electrode being electrically connected with said through conductor means and a second varistor electrode opposing said first varistor electrode through at least a part of said ceramic material having a varistor function and being electrically connected with said external ground electrode means.

* * * * *